(12) United States Patent
Kinsman

(10) Patent No.: US 6,482,674 B1
(45) Date of Patent: Nov. 19, 2002

(54) SEMICONDUCTOR PACKAGE HAVING METAL FOIL DIE MOUNTING PLATE

(75) Inventor: Larry D. Kinsman, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 32 days.

(21) Appl. No.: 09/633,555

(22) Filed: Aug. 7, 2000

Related U.S. Application Data

(62) Division of application No. 09/111,100, filed on Jul. 6, 1998, now Pat. No. 6,215,175.

(51) Int. Cl.⁷ .............................................. H01L 21/44
(52) U.S. Cl. ................... 438/106; 438/108; 438/122; 438/123; 438/125; 257/666
(58) Field of Search .................... 438/106, 108, 438/111–112, 118–119, 121–127, 15, 25–26, 55, 64; 257/666

(56) References Cited

U.S. PATENT DOCUMENTS

| | | |
|---|---|---|
| 4,680,613 A | 7/1987 | Daniels et al. |
| 5,048,179 A | 9/1991 | Shindo et al. |
| 5,182,632 A | 1/1993 | Bechtel et al. |
| 5,428,505 A | 6/1995 | Sakemi et al. |
| 5,559,306 A | 9/1996 | Mahulikar |
| 5,629,561 A | 5/1997 | Shin et al. |
| 5,646,828 A | 7/1997 | Degani et al. |
| 5,648,679 A | 7/1997 | Chillara et al. |
| 5,653,891 A | 8/1997 | Otsuki et al. |
| 5,666,033 A | 9/1997 | Shibata et al. |
| 5,672,548 A | 9/1997 | Colmane et al. |
| 5,805,427 A * | 9/1998 | Hoffman ..................... 361/770 |
| 5,905,299 A | 5/1999 | Lecap |
| 6,002,165 A | 12/1999 | Kinsman |
| 6,049,125 A | 4/2000 | Brooks et al. |
| 6,121,070 A * | 9/2000 | Akram ....................... 438/108 |
| 6,153,924 A | 11/2000 | Kinsman |
| 6,215,175 B1 | 4/2001 | Kinsman |

* cited by examiner

Primary Examiner—Eddie Lee
Assistant Examiner—José R. Diaz
(74) Attorney, Agent, or Firm—Stephen A. Gratton

(57) ABSTRACT

A semiconductor package, and a method for fabricating the package are provided. The package includes a semiconductor die, a lead frame, and a metal foil die mounting plate adapted to mount the die to the lead frame. In addition, the die mounting plate provides a thermally conductive path from the die to terminal leads of the package. Further, the die mounting plate can be configured to perform electrical functions, such as providing ground/power planes for the package, and adjusting an impedance of signal paths through the package. In a first embodiment the package can be fabricated using a tape under frame lead frame. In a second embodiment the package can be fabricated using a lead under chip lead frame.

19 Claims, 3 Drawing Sheets

SEMICONDUCTOR PACKAGE HAVING METAL FOIL DIE MOUNTING PLATE

CROSS REFERENCE TO RELATED APPLICATIONS

This application is a division of patent application Ser. No. 09/111,100 filed on Jul. 6, 1998, now U.S. Pat. No. 6,215,175.

SUMMARY OF THE INVENTION

This invention relates generally to semiconductor packaging, and specifically to an improved semiconductor package having a metal foil die mounting plate. This invention also relates to a method for fabricating the package.

BACKGROUND OF THE INVENTION

Plastic semiconductor packages are fabricated using lead frames. A conventional lead frame comprises a stamped, or etched metal strip, adapted to support multiple dice for packaging. The lead frame supports the dice during a molding process, and provides the internal signal traces and terminal leads in the completed packages. A conventional plastic package includes a semiconductor die attached to a portion of the lead frame, and encapsulated in a plastic body.

One consideration in designing a plastic package is heat transfer from the die. Operation of the integrated circuits within the die generate heat which must be dissipated. In a conventional plastic semiconductor package, the bulk of heat transfer from the encapsulated die is through the terminal leads of the package. However, as circuit densities increase, semiconductor dice generate additional heat, and the leads of the package are not always able to efficiently dissipate the heat.

This has led to the development of semiconductor packages that include a heat sink. Typically, the heat sink comprises a metal plate embedded in the plastic body of the package. Representative heat sink packages are described in U.S. Pat. No. 5,666,003 entitled "Packaged Semiconductor Device Incorporating Heat Sink Plate", and in U.S. Pat. No. 5,629,561 entitled "Semiconductor Package With Integral Heat Dissipator".

One aspect of packages that incorporate a heat sink is that the heat sink is typically an additional component. Accordingly, the heat sink must be incorporated into the package design, and tends to complicate the package fabrication process. Also, the heat sink typically only performs a heat transfer function.

It would be advantageous for a heat sink to perform other functions in the package, such as electrical and structural functions. In addition, it would be advantageous for a fabrication process to incorporate heat sinks into packages without requiring additional complicated steps. The present invention is directed to a package that includes a heat sink element that performs electrical and structural functions. In addition the present invention is directed to a simple fabrication process for forming a heat sink semiconductor package.

SUMMARY OF THE INVENTION

In accordance with the present invention, an improved semiconductor package, and a method for fabricating the package are provided. The package can be fabricated using a tape under frame (TUF) lead frame, or a leads under chip (LUC) lead frame. The package includes a semiconductor die wire bonded to lead fingers of the lead frame, and encapsulated in a plastic body. The package also includes a die mounting plate, which attaches to the lead fingers, and mounts the die to the lead frame.

The die mounting plate comprises a thermally conductive metal foil, about 1 to 4 mils thick, with an adhesive layer on one side for attaching the foil to the lead frame. The die mounting plate provides a direct thermal path from the die, to the terminal leads of the package. In addition, the die mounting plate can be configured as a ground plane, or as a voltage plane, for the package. Still further, the die mounting plate can be configured to adjust an impedance of internal signal traces of the package.

For fabricating the package, the die mounting plate is attached to a die mounting site on the lead frame using the adhesive layer. Next, the die is back bonded to the die mounting plate using a thermally conductive adhesive, such as silicone or epoxy. Next, the die is wire bonded to the lead fingers of the lead frame, and a plastic body formed around the die using a transfer molding process. Finally, the plastic body is separated from a remainder of the lead frame, and the terminal portions of the lead fingers shaped as required to form package leads.

DETAILED DESCRIPTION OF THE PREFERRED EMBODIMENTS

Figure 1A:
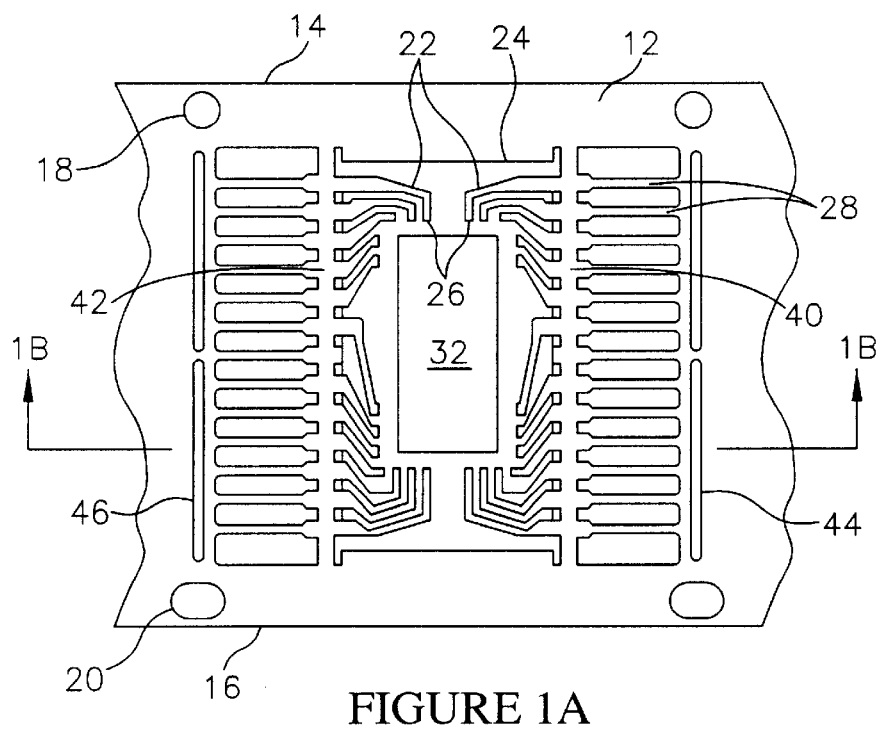
FIG. 1A is a plan view of a lead frame and semiconductor die during fabrication of a package in accordance with the invention.
Figure 1B:
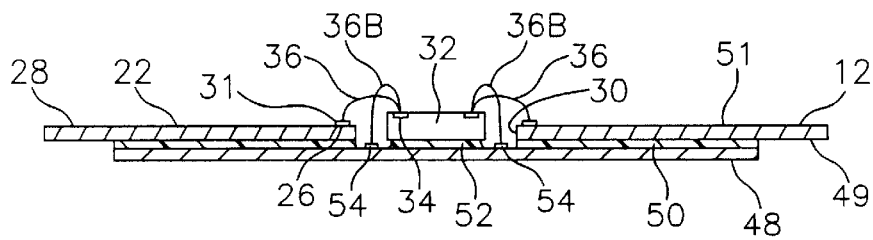
FIG. 1B is cross sectional view taken along section line 1B—1B of FIG. 1A.
Figure 1C:
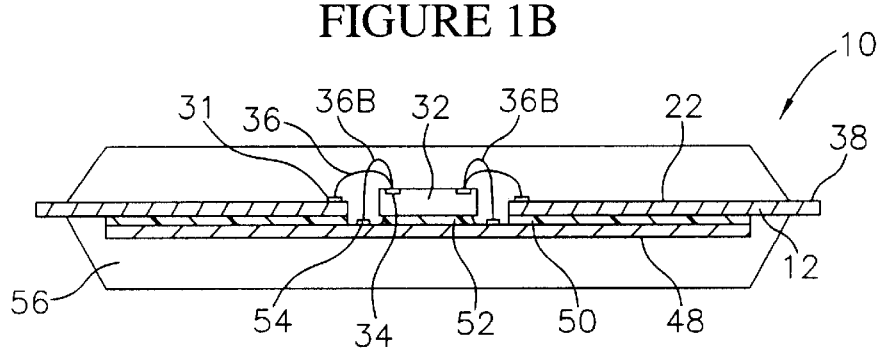
FIG. 1C is a cross sectional view of the completed package.

Referring to FIGS. 1A–1C, steps for fabricating a semiconductor package 10 (FIG. 1C) in accordance with the invention are illustrated. Initially, as shown in FIG. 1A, a lead frame 12 is provided. For simplicity, only a single die mounting site 24 on the lead frame 12 is illustrated. However, it is to be understood that the lead frame 12 can be configured to package one, or more, semiconductor dice, and can include multiple die mounting sites 24 (e.g., eight to twelve).

In the embodiment of FIGS. 1A–1C, the lead frame 12 can be similar in construction to a conventional tape under frame (TUF) lead frame. With a tape under frame lead frame, the die is attached to the lead frame using a polymer tape such as "KAPTON" tape manufactured by DuPont, or "UPLEX" tape manufactured by Mitsubishi. With the package 10 (FIG. 1C) of the invention, the polymer tape is eliminated and replaced by a metal foil die mounting plate 48 (FIG. 1B).

The lead frame 12 includes side rails 14, 16 having patterns of openings 18, 20 formed therein. The side rails 14, 16 and openings 18, 20 permit handling of the lead frame 12 by automated packaging machinery. The lead frame 12 also includes a pattern of lead fingers 22 associated with each die mounting site 24. The lead fingers 22 include tip portions 26 and terminal portions 28. The peripheral edges of the tip portions 26 of the lead fingers 22 form a generally rectangular shaped opening 30 (FIG. 1B) wherein a semiconductor die 32 (FIG. 1B) is mounted. In general, the tip portions 26 of the lead fingers 22 are spaced from but proximate to a periphery of the die 32.

The tip portions 26 of the lead fingers 22 are configured for electrical communication with bonding pads 34 (FIG. 1B) on the die 32. In FIG. 1A, the die 32 is illustrated prior to wire bonding. In FIG. 1B, wires 36 have been wire bonded to the bonding pads 34 on the die 32, and to bonding sites 31 on the tip portions 26 of the lead fingers 22. In the completed package 10 (FIG. 1C), the tip portions 26 of the lead fingers 22 form internal signal traces for the package 10. The terminal portions 28 of the lead fingers 22 form terminal leads 38 (FIG. 1C) for the package 10.

The tip portions 26 and terminal portions 28 of the lead fingers 22 are joined together and stabilized by connecting segments 40, 42 (FIG. 1A). Following the molding process, the connecting segments 40, 42 between the lead fingers 22 will be severed, such that each tip portion 26, and its associated terminal portion 28, forms a separate conductive path through the package 10 (FIG. 1C) to the die 32. The lead frame 12 also includes through slots 44, 46 (FIG. 1A) which define the boundaries between each die mounting site 24. Following a molding process, the lead frame 12 can be severed in a transverse direction through the slots 44, 46 to form a plurality of separate packages 10 (FIG. 1A).

As shown in FIG. 1B, the die mounting plate 48 can be attached to a first side 49 of the lead frame 12. The lead frame 12 also includes an opposing second side 51 wherein the bonding sites 31 on the lead fingers 22 are located.

The die mounting plate 48 comprises a piece of metal foil with an adhesive layer 50 formed thereon. Preferably, the metal foil comprises a highly conductive material such as copper, aluminum, nickel, titanium, silver, steel and alloys of these metals ("ALLOY 42)". A representative thickness of the metal foil can be from about 1 mil (0.001") to 4 mils (0.004") or greater. A peripheral outline of the die mounting plate 48 can be generally rectangular (or alternately generally square), and slightly larger than the peripheral outline of the die 32. In addition, the die mounting plate 48 can be large enough to cover the rectangular opening 30 (FIG. 1B) formed by the tip portions 26 of the lead fingers 22.

The adhesive layer 50 can be formed of a thermosetting adhesive, or a thermoplastic adhesive. For example, the adhesive layer 50 can comprise a pressure sensitive adhesive formed on a surface of a metal foil with a uniform thickness. Alternately, the adhesive layer 50 can be formed directly on the lead fingers 22 rather than on the die mounting plate 48.

Suitable adhesives for the adhesive layer 50 include epoxies, acrylics, silicones and polyimides. A representative thickness of the adhesive layer 50 can be about 0.8 mil (0.0008") to 1.5 mils (0.0015). As will be further explained, the thickness of the adhesive layer 50 can be used to maintain a desired spacing between the lead fingers 22 and the die mounting plate 48. The die mounting plate 48 can be attached to the lead frame 12 using heat and pressure, and the adhesive layer 50 can be cured, if required, using an oven or other heat source.

Following attachment of the die mounting plate 48 to the lead frame 12, the die 32 can be attached to the die mounting plate 48. An adhesive layer 52 can be used to attach the die 32 to the die mounting plate 48. In particular, the adhesive layer 52 attaches the back side of the die 32 to the die mounting plate 48. This leaves the bonding pads 34 on the die 32 exposed for wire bonding to the bonding sites 31 formed on the second side 51 of the lead frame 12.

Preferably, the adhesive layer 52 comprises a thermally conductive material, such that heat transfer from the die to the die mounting plate 48 is facilitated. Suitable materials for the adhesive layer 50 include thermally conductive epoxies, and metal filled silicone.

In the completed package 10, the die mounting plate 48 attaches the die 32 to the lead fingers 22, and provides a direct thermal path between the die 32 and the terminal leads 38 (FIG. 1C) of the package 10. This improves heat transfer from the die 32 to the terminal leads 38. Also, since the die mounting plate 48 comprises metal foil, which in general has a low moisture content, the package 10 has a lower moisture content than conventional packages that employ polymer tape.

In addition to performing structural and heat transfer functions, the die mounting plate 48 can also perform electrical functions. For example, the die mounting plate 48 can be spaced from the lead fingers 22 by a distance selected to provide a desired impedance in the lead fingers 22. An impedance of the lead fingers 22 can thus be matched to that of another electrical component, such as mating conductive traces on a printed circuit board, or other electrical assembly that includes the package 10.

The die mounting plate 48 can also be configured as a power plane, or as a ground plane, for the die 32. In this case, wires 36B (FIG. 1B) can be wire bonded to selected bond pads 34 (e.g., Vcc or Vss pads) on the die 32, and to corresponding bonding sites 54 on the die mounting plate 48. If desired, the bonding sites 54 can comprise a deposited metal pad, or areas of increased thickness, on the die mounting plate 48. In addition, the die mounting plate 48 can be placed in electrical communication with selected terminal leads 38 using wire bonds, or other electrical members.

Another electrical function that is performed by the die mounting plate 48 is lowering of the inductance of the package 10. For example, if the die mounting plate 48 is configured as a ground plane, inductance of the package 10 will be lowered. However, even an ungrounded die mounting plate 48 will have some affect in lowering inductance. The larger the surface area of the die mounting plate 48, the greater the impact on inductance.

Referring to FIG. 1C, following wire bonding of the die 32 to the lead fingers 22, a plastic body 56 of the package 10 can be formed using a conventional molding process. The plastic body 56 completely encapsulates the die 32, the wires 36, 36B, and the die mounting plate 48. Following formation of the plastic body 56, the terminal leads 38 can be shaped in a desired configuration (e.g., J-bend, gull wing, butt joint, etc.) using a conventional trim and form process.

Figure 1D:
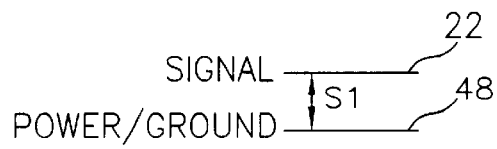
FIG. 1D is a schematic electrical diagram of the package.

As shown schematically in FIG. 1D, the lead fingers 22 form the signal traces for the package 10. The die mounting plate 48 can form a power/ground plane for the package 10. In addition, a separation distance S1 between the lead fingers 22 and die mounting plate 48 can be selected to provide a desired impedance of the lead fingers 22.

Figure 2A:
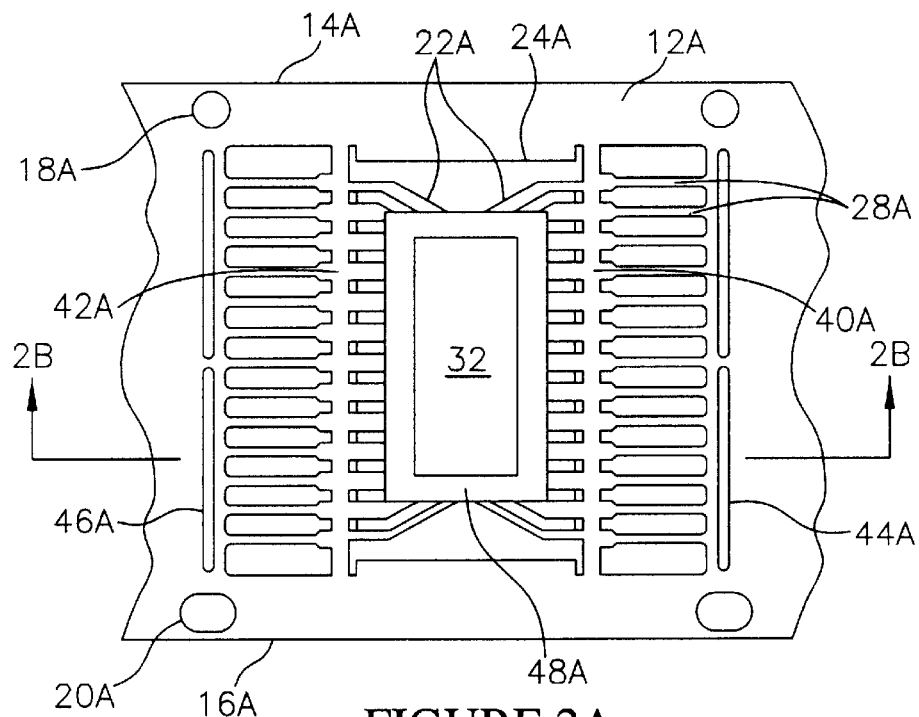
FIG. 2A is a plan view of a lead frame and semiconductor die during fabrication of an alternate embodiment package in accordance with the invention.
Figure 2B:
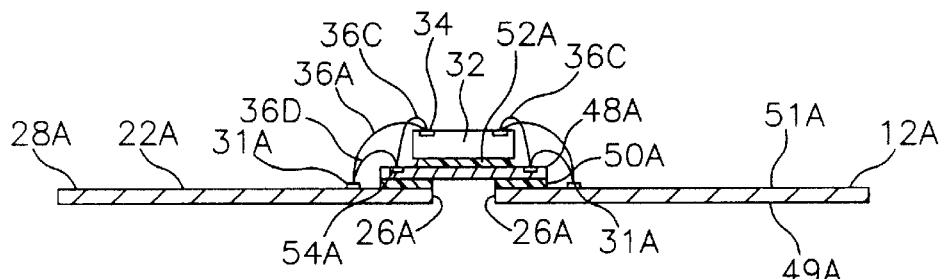
FIG. 2B is a cross sectional view taken along section line 2B—2B of FIG. 2A.
Figure 2C:
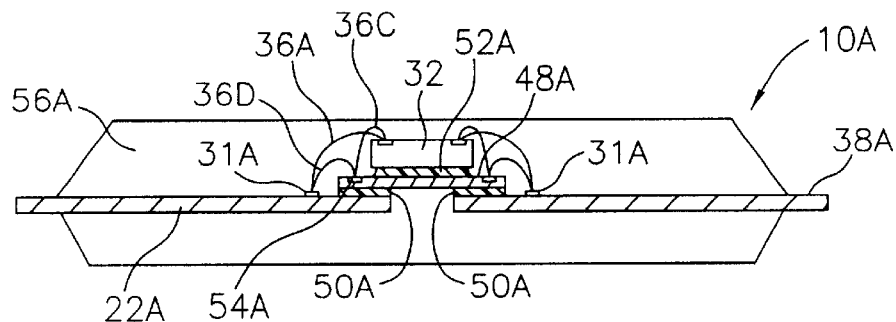
FIG. 2C is a cross sectional view of the completed alternate embodiment package.

Referring to FIGS. 2A–2C, an alternate embodiment semiconductor package 10A (FIG. 2C) is illustrated. As with the previous package 10 (FIG. 1C) a lead frame 12A (FIG.

2A) is provided. However, in this case the lead frame 12A is similar to a leads under chip (LUC) lead frame. With a leads under chip lead frame, the lead fingers extend under the die 32 and are adapted to support the die 32. In addition, a polymer tape as previously described attaches the die to the lead frame. With the present package 10A (FIG. 2C) the polymer tape is eliminated.

As before the lead frame 12A includes a first side 49A (FIG. 2B) and an opposing second side 51A (FIG. 2B). The lead frame 12A also includes multiple die mounting sites 24A formed on the second side 51A. In addition, the lead frame 12A includes siderails 14A, 16A with openings 18A, 20A, substantially as previously described for lead frame 12 (FIG. 1A). The lead frame 12A also includes lead fingers 22A having tip portions 26A (FIG. 2A), and terminal portions 28A. As shown in FIG. 2A, the tip portions 26A of the lead fingers 22A extend under the die 32 and are configured to support the die 32. The lead frame 12A also includes connecting segments 40A, 42A and slots 44A, 46A.

As shown in FIG. 2B, a die mounting plate 48A is mounted on the second side 51A of the lead frame 12A. In particular, the die mounting plate 48A attaches to the lead fingers 22A, and is supported by the tip portions 26A of the lead fingers 22A. The die mounting plate 48A comprises metal foil, substantially as previously described for die mounting plate 48 (FIG. 1C). In addition, an adhesive layer 50A attaches the die mounting plate 48 to the lead fingers 22A. The adhesive layer 50A comprises a thermosetting or thermoplastic adhesive, substantially as previously described for adhesive layer 50 (FIG. 1C). As before, the adhesive layer 50 can be formed on the die mounting plate 48 in a pattern that matches the pattern of the lead fingers 22A. Alternately, the adhesive layer 50 can be formed directly on the lead fingers 22A.

The die 32 can be attached to the die mounting plate 48 using an adhesive layer 52A. The adhesive layer 52A can comprise a thermally conductive adhesive, substantially as previously described for adhesive layer 52 (FIG. 1B). In addition, wires 36A can be wire bonded to the die bonding pads 34 and to bonding sites 31A on the lead fingers 22A. As shown in FIG. 2C, the package 10A also includes a plastic body 56A having terminal leads 38A. In the package 10A, the die mounting plate 48A provides a direct thermal path from the die 32 to the terminal leads 38A. In addition, the die mounting plate 48A lowers the inductance of the package 10A. Also, the die mounting plate 48A can be configured to perform other electrical functions such as impedance matching.

The die mounting plate 48A can also be configured as a ground or power plane for the die 32. In this case, wires 36C can be wire bonded to the bond pads 34 on the die 32 and to selected bonding sites 31A on the lead fingers 22A. Similarly, wires 36D can be wire bonded to selected bonding sites 31A on the lead fingers 22A and to selected bonding sites 54A on the die mounting plate 48A.

Figure 2D:
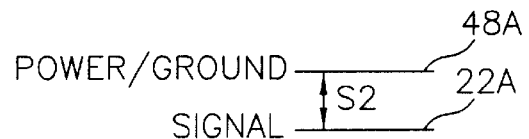
FIG. 2D is a schematic electrical diagram of the alternate embodiment package.

As shown schematically in FIG. 2D, the lead fingers 22A form the signal traces for the package 10A. The die mounting plate 48A can form a power/ground plane for the package 10A. In addition, a separation distance S2 between the lead fingers 22A and die mounting plate 48A can be selected to provide a desired impedance of the signal traces.

Figure 3:
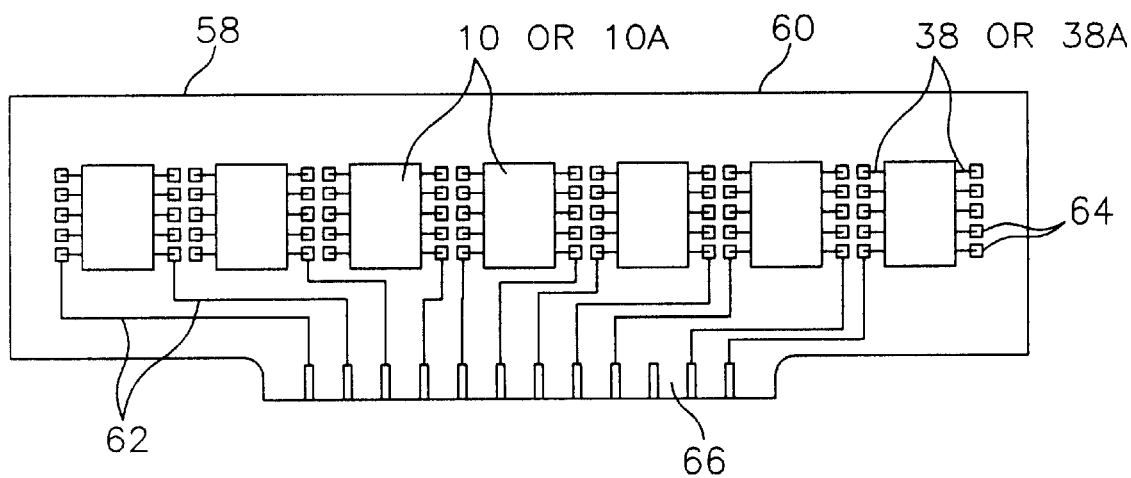
FIG. 3 is a schematic plan view of an electronic assembly fabricated using a package constructed in accordance with the invention.

Referring to FIG. 3, a memory module 58 constructed with semiconductor packages 10 (or 10A) is illustrated. The memory module 58 includes a substrate 60 on which multiple semiconductor packages 10 (or 10A) are mounted. The substrate 60 can comprise an electrically insulating material, such as ceramic, or a glass filled resin. The substrate 60 includes electrodes 64 which are electrically connected to the terminal leads 38 (or 38A) on the packages 10 (or 10A) such as by soldering, or with conductive adhesives. The substrate 60 also includes conductive traces 62 and an edge connector 66 in electrical communication with the electrodes 64.

The impedance of the terminal leads 38 (or 38A) and lead fingers 22 (or 22A) of the packages 10 (or 10A) can be matched to the impedance of the conductive traces 62 on the substrate 60 by selecting a desired spacing distance S1-FIG. 1D (or S2-FIG. 2D) of the die mounting plate 48 (or 48A). In general, the spacing distance S1 (or S2) will be a function of the thickness of the adhesive layer 50-FIG. 1C (or 50A-FIG. 2C).

Thus the invention provides an improved semiconductor package that includes a metal foil die mounting plate. The die mounting plate forms a structural member for mounting the die to the lead frame, and provides a direct heat transfer path from the die to the package leads. In addition, the die mounting plate can perform electrical functions such as lowering package inductance, providing power/ground planes for the package, and providing matching impedances in package signal traces. Still further, the die mounting plate comprises metal foil which has a lower moisture content than polymer tapes used in conventional tape under frame and lead under chip packages.

Although the invention has been described with reference to certain preferred embodiments, as will be apparent to those skilled in the art, certain changes and modifications can be made without departing from the scope of the invention as defined by the following claims.

I claim:

1. A method for fabricating a semiconductor package comprising:

providing a semiconductor die comprising a plurality of bond pads;

providing a metal lead frame comprising a plurality of lead fingers having a plurality of bonding sites;

providing a die mounting plate comprising a metal foil having a thickness of less than four mils;

attaching the die mounting plate to the lead fingers;

attaching the die to the die mounting plate;

bonding wires to the bond pads on the die and to the bonding sites on the lead fingers;

forming a plastic body on the die and the metal lead frame; and forming the lead fingers into terminal leads for the package.

2. The method of claim 1 wherein the attaching the die to the die mounting plate step comprises forming a thermally conductive adhesive therebetween.

3. The method of claim 1 wherein the metal lead frame comprises a tape under frame lead frame or a leads under chip lead frame.

4. The method of claim 1 wherein the metal foil has a thickness of from one mil to four mils.

5. The method of claim 1 wherein the metal foil comprises a metal selected from the group consisting of copper, aluminum, nickel, titanium, silver, steel, and alloys of these metals.

6. A method for fabricating a semiconductor package comprising:

providing a semiconductor die having a plurality of bond pads;

providing a metal lead frame comprising a plurality of lead fingers having tip portions configured to support the die, terminal portions, and a plurality of bonding sites;

providing a die mounting plate comprising a metal foil having a thickness of from one mil to four mils;

attaching the die mounting plate to the tip portions of the lead fingers;

attaching the die to the die mounting plate;

bonding wires to the bond pads on the die and to the bonding sites on the lead fingers;

forming a plastic body on the die and on the tip portions of the lead fingers; and forming the terminal portions of the lead fingers into terminal leads for the package.

7. The method of claim 6 wherein the metal lead frame comprises a tape under frame lead frame.

8. The method of claim 6 wherein the metal lead frame comprises a leads under chip lead frame.

9. The method of claim 6 wherein the attaching the die to the die mounting plate step comprises forming a thermally conductive adhesive layer therebetween.

10. The method of claim 6 wherein the metal foil comprises a metal selected from the group consisting of copper, aluminum, nickel, titanium, silver, steel and alloys of these metals.

11. A method for fabricating a semiconductor package comprising:

providing a semiconductor die having a plurality of bond pads;

providing a metal lead frame having a first side and an opposing second side, the lead frame comprising a plurality of lead fingers having tip portions, terminal portions, and bonding sites on the tip portions on the second side;

providing a die mounting plate comprising a metal foil having a thickness of less than four mils;

attaching the die mounting plate to the first side of the lead fingers;

attaching the die to the die mounting plate;

bonding wires to the bond pads on the die and to the bonding sites on the lead fingers;

forming a plastic body on the die and on the metal lead frame; and forming the terminal portions of the lead fingers into terminal leads for the package with the die mounting plate providing a direct thermal path between the die and the terminal leads.

12. The method of claim 11 wherein the metal lead frame comprises a tape under frame lead frame.

13. The method of claim 11 further comprising bonding at least one wire to a bond pad on the die and to a second bonding site on the die mounting plate.

14. The method of claim 11 wherein the attaching the die to the die mounting plate step comprises forming a thermally conductive adhesive layer therebetween.

15. The method of claim 11 wherein the attaching the die mounting plate to the metal lead frame step comprises forming an adhesive layer therebetween having a thickness selected to space the die mounting plate from the lead frame by a desired distance.

16. The method of claim 11 further comprising spacing the die mounting plate from the lead fingers during the attaching the die mounting plate to the first side of the lead fingers step by a distance selected to match an impedance of the lead fingers.

17. A method for fabricating a semiconductor package comprising:

providing a semiconductor die having a plurality of bond pads;

providing a leads under chip metal lead frame comprising a plurality of lead fingers including tip portions, terminal portions and a plurality of bonding sites;

providing a die mounting plate comprising a metal foil having a thickness less than four mils;

attaching the die mounting plate to the tip portions of the lead fingers;

attaching the die to the die mounting plate;

bonding wires to the bond pads on the die and to the bonding sites on the lead fingers;

forming a plastic body on the die and on the metal lead frame; and forming the terminal portions of the lead fingers into terminal leads for the package with the die mounting plate providing a direct thermal path between the die and the terminal leads.

18. The method of claim 17 further comprising bonding at least one wire to a bond pad on the die and to a second bonding site on the die mounting plate.

19. The method of claim 17 further comprising spacing the die mounting plate from the lead frame during the attaching the die mounting plate to the tip portions of the lead fingers step by a selected distance.

\* \* \* \* \*